US012573588B2

(12) United States Patent
Guo et al.

(10) Patent No.: US 12,573,588 B2
(45) Date of Patent: Mar. 10, 2026

(54) PLASMA PROCESSING SYSTEM CONFIGURED TO DELIVER A PULSED VOLTAGE WAVEFORM

(71) Applicant: Applied Materials, Inc., Santa Clara, CA (US)

(72) Inventors: Yue Guo, Redwood City, CA (US); Denis Martin Koosau, Sunnyvale, CA (US); Anuj Kaundal, Bangalore (IN); Travis Lee Koh, Sunnyvale, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/624,307

(22) Filed: Apr. 2, 2024

(65) Prior Publication Data

US 2025/0308847 A1 Oct. 2, 2025

(51) Int. Cl.
*H01J 37/32* (2006.01)

(52) U.S. Cl.
CPC .. *H01J 37/32146* (2013.01); *H01J 37/32128* (2013.01); *H01J 37/32165* (2013.01);
(Continued)

(58) Field of Classification Search
CPC .......... H01J 37/32146; H01J 37/32128; H01J 37/32165; H01J 37/32183;
(Continued)

(56) References Cited

U.S. PATENT DOCUMENTS

| | | | |
|---|---|---|---|
| 9,263,237 | B2 | 2/2016 | Choi |
| 10,825,657 | B2 | 11/2020 | Yokogawa et al. |

(Continued)

FOREIGN PATENT DOCUMENTS

| | | |
|---|---|---|
| JP | 6832800 B2 | 2/2021 |
| KR | 20170074750 A | 6/2017 |

OTHER PUBLICATIONS

International Search Report issue to PCT/US2025/021936 on Jul. 8, 2025.

*Primary Examiner* — Adam D Houston
(74) *Attorney, Agent, or Firm* — Patterson + Sheridan, LLP; B. Todd Patterson

(57) ABSTRACT

A plasma processing system includes a pulsed voltage source configured to generate a pulsed voltage waveform having a first frequency. The plasma processing system includes a radio frequency source configured to generate a radio frequency waveform having a second frequency that is higher than the first frequency. The plasma processing system includes a junction box enclosure electrically coupling the pulsed voltage source to a direct current conductor coupled to a substrate support and further electrically coupling the pulsed voltage source to a radio frequency conductor coupled to a radio frequency baseplate. The junction box enclosure includes a pulsed voltage filter circuit coupled between the radio frequency source and the radio frequency conductor and operable to filter the pulsed voltage waveform. The junction box enclosure further includes a radio frequency filter circuit coupled between the pulsed voltage source and the direct current conductor and operable to filter the radio frequency waveform.

20 Claims, 11 Drawing Sheets

(52) U.S. Cl.
CPC .. *H01J 37/32183* (2013.01); *H01J 37/32577*
(2013.01); *H01J 37/32715* (2013.01); *H01J*
*2237/327* (2013.01); *H01J 2237/3341*
(2013.01)

(58) Field of Classification Search
CPC ........... H01J 37/32577; H01J 37/32715; H01J
2237/327; H01J 2237/3341
See application file for complete search history.

(56)                     References Cited

U.S. PATENT DOCUMENTS

| | | | |
|---|---|---|---|
| 11,462,389 | B2 | 10/2022 | Dorf et al. |
| 11,476,090 | B1 * | 10/2022 | Ramaswamy .... H01J 37/32146 |
| 11,569,066 | B2 * | 1/2023 | Cubaynes .......... H03K 17/6871 |
| 11,948,780 | B2 | 4/2024 | Cui et al. |
| 12,237,148 | B2 * | 2/2025 | Dorf ................. H01J 37/32715 |
| 12,354,846 | B2 * | 7/2025 | Shindo ............... H01J 37/32211 |
| 12,368,020 | B2 * | 7/2025 | Azad ................. H01J 37/32091 |
| 2020/0251371 | A1 * | 8/2020 | Kuno ................. H01L 21/6831 |
| 2022/0037121 | A1 * | 2/2022 | Dorf ................. H01J 37/32128 |
| 2022/0415615 | A1 * | 12/2022 | Cubaynes ............... H02M 7/49 |
| 2023/0154727 | A1 | 5/2023 | Park |
| 2024/0145215 | A1 * | 5/2024 | Dash ................. H01J 37/32146 |
| 2024/0153741 | A1 * | 5/2024 | Cui .................. H01J 37/32128 |
| 2024/0162007 | A1 * | 5/2024 | Li ..................... H01J 37/32091 |
| 2025/0046576 | A1 * | 2/2025 | Guo ................. H01J 37/32706 |
| 2025/0218748 | A1 * | 7/2025 | Guo ................. H01J 37/32183 |

* cited by examiner

PLASMA PROCESSING SYSTEM CONFIGURED TO DELIVER A PULSED VOLTAGE WAVEFORM

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably producing high aspect ratio features is one of the key technology challenges for the next generation of very large scale integration (VLSI) and ultra large scale integration (ULSI) of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in an RIE processing chamber and ions from the plasma are accelerated towards a surface of a substrate to form openings in a material layer disposed beneath a mask layer formed on the surface of the substrate.

A typical Reactive Ion Etch (RIE) plasma processing chamber includes a radio frequency (RF) bias generator, which supplies an RF voltage to a "power electrode" (e.g., a biasing electrode), such as a metal plate positioned adjacent to an "electrostatic chuck" (ESC) assembly, more commonly referred to as the "cathode". The power electrode can be capacitively coupled to the plasma of a processing system through a thick layer of dielectric material (e.g., ceramic material), which is a part of the ESC assembly. In a capacitively coupled gas discharge, the plasma is created by using a radio frequency (RF) generator that is coupled to an RF electrode through an RF matching network ("RF match") that tunes the apparent load to 50Ω to minimize the reflected power and maximize the power delivery efficiency. The application of RF voltage to the power electrode causes an electron-repelling plasma sheath (also referred to as the "cathode sheath") to form over a processing surface of a substrate that is positioned on a substrate supporting surface of the ESC assembly during processing. The non-linear, diode-like nature of the plasma sheath results in rectification of the applied RF field, such that a direct-current (DC) voltage drop, or "self-bias", appears between the substrate and the plasma, making the substrate potential negative with respect to the plasma potential. This voltage drop determines the average energy of the plasma ions accelerated towards the substrate, and thus etch anisotropy. More specifically, ion directionality, the feature profile, and etch selectivity to the mask and the stop-layer are controlled by the Ion Energy Distribution Function (IEDF). In plasmas with RF bias, the IEDF typically has two non-discrete peaks, one at a low energy and one at a high energy, and an ion population that has a range of energies that extend between the two peaks. The presence of the ion population in-between the two peaks of the IEDF is reflective of the fact that the voltage drop between the substrate and the plasma oscillates at the RF bias frequency. When a lower frequency RF bias generator is used to achieve higher self-bias voltages, the difference in energy between these two peaks can be significant; and because the etch profile due to the ions at low energy peak is more isotropic, this could potentially lead to bowing of the etched feature walls. Compared to the high-energy ions, the low-energy ions are less effective at reaching the corners at the bottom of the etched feature (e.g., due to the charging effect), but cause less sputtering of the mask material. This is important in high aspect ratio etch applications, such as hard-mask opening or dielectric mold etch. As feature sizes continue to diminish and the aspect ratio increases, while feature profile control requirements become more stringent, it becomes more desirable to have a well-controlled IEDF at the substrate surface during processing.

Other conventional plasma processes and processing chamber designs have also found that delivering multiple different RF frequencies to one or more of the electrodes in a plasma processing chamber can be used to control various plasma properties, such as plasma density, ion energy, and/or plasma chemistry. However, it has been found that the delivery of multiple conventional sinusoidal waveforms from two or more RF sources, which are each configured to provide different RF frequencies, is unable to adequately or desirably control the sheath properties and can lead to undesirable arcing problems. Moreover, due to direct or capacitive coupling between the RF sources during processing, each RF source may induce an RF current that is provided to the output of the other connected RF source(s) (e.g., often referred to as the "cross-talk"), resulting in the power being diverted away from the intended load (plasma), as well as a possibly causing damage to each of the RF sources.

Accordingly, there is a need in the art for novel, robust and reliable plasma processing and biasing methods that enable maintaining a nearly constant sheath voltage, and thus create a desirable and repeatable IEDF at the surface of the substrate to enable a precise control over the shape of IEDF and, in some cases, the etch profile of the features formed in the surface of the substrate.

SUMMARY

Embodiments provided herein generally include apparatus, plasma processing systems and methods for generation of a waveform for plasma processing of a substrate in a processing chamber.

In one aspect, a plasma processing system is provided. The plasma processing system includes a processing chamber defining a processing volume. The plasma processing system further includes a substrate support assembly disposed within the processing volume. The substrate support assembly includes a radio frequency baseplate and a substrate support positioned on the radio frequency baseplate. The plasma processing system includes a pulsed voltage source configured to generate a pulsed voltage waveform having a first frequency. The plasma processing system includes a radio frequency source configured to generate a radio frequency waveform having a second frequency that is higher than the first frequency. The plasma processing system includes a junction box enclosure electrically coupling the pulsed voltage source to a direct current conductor coupled to the substrate support and further electrically coupling the pulsed voltage source to a radio frequency conductor coupled to the radio frequency baseplate. The junction box enclosure includes a pulsed voltage filter circuit coupled between the radio frequency source and the radio frequency conductor and operable to filter the pulsed voltage waveform. The junction box enclosure further includes a radio frequency filter circuit coupled between the pulsed voltage source and the direct current conductor and operable to filter the radio frequency waveform.

In another aspect, a plasma processing system is provided. The plasma processing system includes a processing chamber defining a processing volume. The plasma processing system includes a substrate support assembly disposed within the processing volume. The substrate support assembly includes a radio frequency baseplate and a substrate support positioned on the radio frequency baseplate. The plasma processing system includes an inductively coupled plasma assembly. The inductively coupled plasma assembly includes a radio frequency coil positioned outside of the processing volume. The inductively coupled plasma assembly further includes a first radio frequency source configured to drive the radio frequency coil. The plasma processing system includes a pulsed voltage source configured to generate a pulsed voltage waveform having a first frequency. The plasma processing system includes a second radio frequency source configured to generate a radio frequency waveform having a second frequency that is higher than the first frequency. The plasma processing system includes a junction box enclosure electrically coupling the pulsed voltage source to a direct current conductor coupled to the substrate support and further electrically coupling the pulsed voltage source to a radio frequency conductor coupled to the radio frequency baseplate. The junction box enclosure includes a pulsed voltage filter circuit coupled between the second radio frequency source and the radio frequency conductor and operable to filter the pulsed voltage waveform. The junction box enclosure further includes a radio frequency filter circuit coupled between the pulsed voltage source and the direct current conductor and operable to filter the radio frequency waveform.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

Figure 1A:
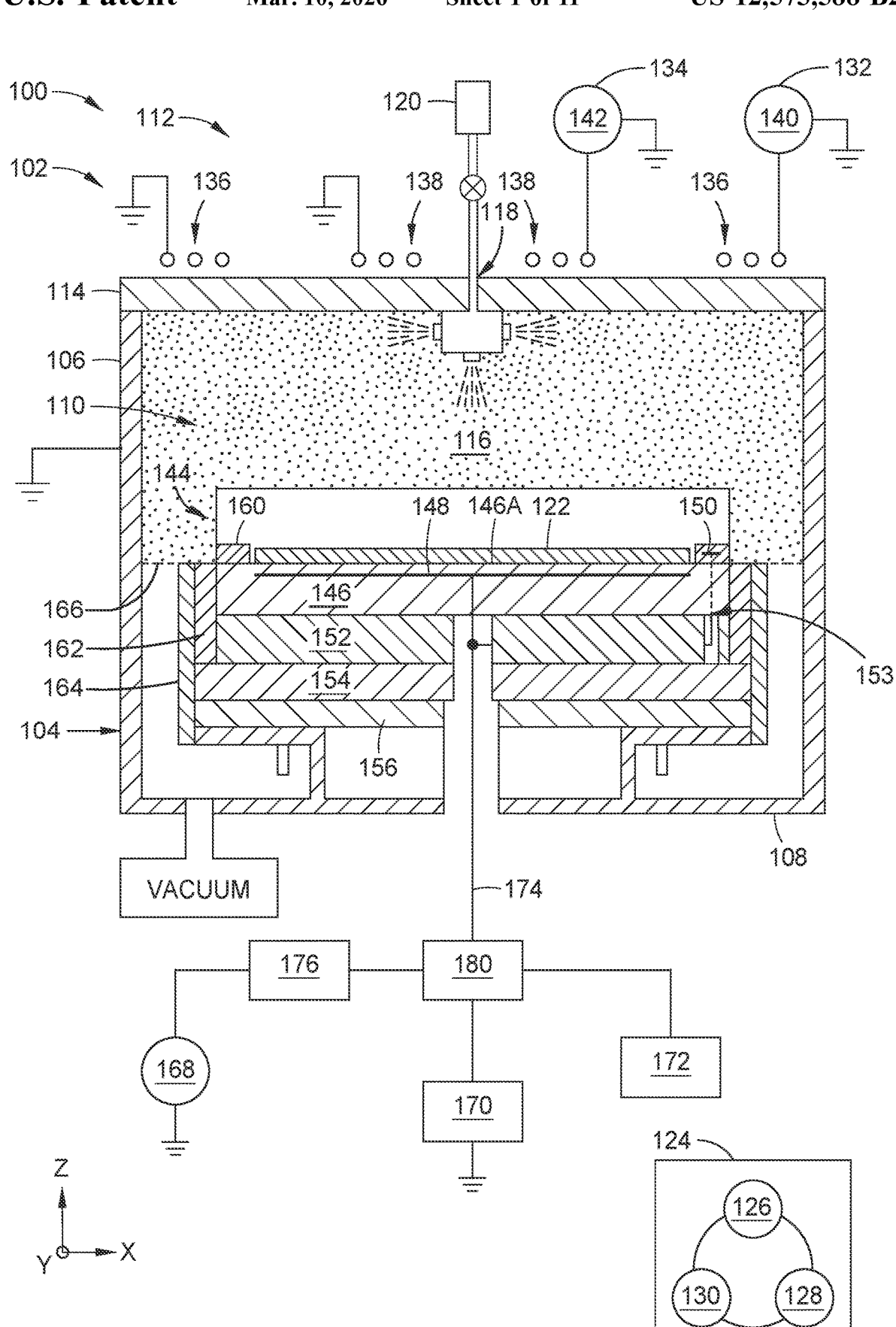
FIG. 1A depicts a schematic side cross-sectional view of a plasma processing system according to some embodiments of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Example aspects of the present disclosure are directed to a junction box enclosure for plasma processing systems that includes at least a pulsed voltage source configured to generate a pulsed voltage waveform (e.g., having a series of harmonics) having a first frequency (e.g., about 100 kilohertz (kHz) to 2 megahertz (MHz)) and a radio frequency bias source configured to generate a radio frequency waveform having a second frequency (e.g., between 2 MHz and 200 MHZ) that is higher than the first frequency. In some embodiments, the first frequency may correspond to a first harmonic (e.g., fundamental harmonic) included in the series of harmonics that make up the pulsed voltage waveform. In alternative embodiments, the first frequency may correspond to a different harmonic (e.g., other than the first harmonic) of the pulsed voltage waveform. The waveforms (that is, pulsed voltage waveform and radio frequency waveform) may be delivered to components of a substrate support assembly for a plasma processing system that includes a substrate support (e.g., including a bias electrode and an edge control electrode) and a radio frequency baseplate on which the substrate support is positioned.

Junction boxes according to the present disclosure may electrically couples the radio frequency bias source to a radio frequency conductor (e.g., of a power delivery line) connected to the radio frequency baseplate. In this manner, the radio frequency waveform generated by the radio frequency bias source may be provided to the radio frequency plate to, for example, generate plasma within a processing volume of a plasma processing system. In addition, the junction box enclosure may electrically couple the pulsed voltage source to at least one of the radio frequency conductor or a direct current conductor (e.g., also of the power delivery line) connected to the substrate support (e.g., a bias electrode thereof). In this manner, the pulsed voltage waveform generated by the pulsed voltage source may be delivered to at least one of the radio frequency baseplate and the substrate support.

Junction boxes according to the present disclosure may include dedicated filter circuits for the radio frequency bias source and the pulsed voltage source. For instance, a junction box enclosure may include a pulsed voltage waveform filter circuit (e.g., bandpass filter) coupled between the radio frequency bias source and the radio frequency conductor of the power delivery line. The pulsed voltage waveform filter circuit allows the radio frequency waveform generated by the radio frequency bias source to be delivered to the radio frequency baseplate. In addition, the pulsed voltage waveform filter circuit filters (e.g., block) the pulsed voltage waveform generated by the pulsed voltage source. In this manner, the pulsed voltage waveform filter circuit may prevent the pulsed voltage waveform from coupling into the radio frequency bias source which, in some instances, could damage the radio frequency bias source.

The junction box enclosure further includes a radio frequency filter circuit (e.g., bandstop filter) coupled between the pulsed voltage source and the direct current conductor of the power delivery line. The radio frequency filter circuit allows the pulsed voltage waveform generated by the pulsed voltage source to be delivered to the substrate support (e.g., the bias electrode thereof). In addition, the radio frequency filter circuit filters the radio frequency waveform generated by the radio frequency bias source. In this manner, the radio frequency filter circuit prevents the radio frequency waveform from coupling into the pulsed voltage source which, in some instances, could damage the pulsed voltage source.

Example aspects of the present disclosure are also directed to junction box enclosures (e.g., illustrated in FIGS. 6A, 6B, and 6C) configured to electrically couple the pulsed voltage source to both the substrate support (e.g., bias electrode thereof) and the radio frequency baseplate so that the pulsed voltage waveform generated by the pulsed voltage source may be simultaneously delivered to the substrate support and the radio frequency baseplate. By providing the pulsed voltage waveform generated by the pulsed voltage source to both the substrate support and the radio frequency baseplate, junction box enclosures according to the present disclosure allow plasma processing systems to implement a single output pulsed voltage source as opposed to two separate pulsed voltage sources, one that generates a pulsed voltage source for the substrate support and another that generates a pulsed voltage source for the radio frequency baseplate.

Example aspects of the present disclosure provide numerous technical effects and benefits. For instance, the junction box enclosure may according to the present disclosure may be implemented in plasma processing systems that, for example, include an inductive coil (e.g., positioned outside the processing volume) driven by a radio frequency source to generate plasma within the processing volume to provide greater flexibility in how the plasma is generated. For example, adding the junction box enclosure to such plasma processing systems would allow the plasma processing to generate inductively coupled plasma (e.g., via the inductive coil driven by the radio frequency source) or capacitively coupled plasma (e.g., via the radio frequency source and/or the pulsed voltage source connected to the junction box). Adding such capability to a plasma processing system provide greater control over various parameters (e.g., control ion to radio ratio, ion energy, etc.) of the process than are possible using conventional plasma processing systems.

Plasma Processing System

FIG. 1A is a schematic cross-sectional view of a plasma processing system 100 according to some embodiments of the present disclosure. The plasma processing system 100 is configured for plasma-assisted etching processes, such as a reactive ion etch (RIE) plasma processing. However, it should be noted that the plasma processing system 100 may be configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

The plasma processing system 100 generally includes a processing chamber 102. The processing chamber 102 includes a chamber body 104. The chamber body 104 includes one or more sidewalls 106 and a chamber base 108. The sidewall(s) 106 and chamber base 108 collectively define a processing volume 110. The processing chamber 102 further includes a lid assembly 112 having a chamber lid 114. As shown, the chamber lid 114 may be positioned on the chamber body 104 to enclose the processing volume 110.

The sidewall(s) 106 and the chamber base 108 generally include materials that are sized and shaped to form the structural support for components of the processing chamber 102 and are therefore configured to withstand the pressures and added energy applied thereto when a plasma 116 is generated within a vacuum environment maintained in the processing volume 110. For example, the sidewall(s) 106 and the chamber base 108 may be formed from a metal, such as aluminum, an aluminum alloy, or a stainless steel alloy.

In some embodiments, the plasma processing system 100 may include a gas inlet 118 disposed through the chamber lid 114. The gas inlet 118 may deliver one or more processing gases to the processing volume 110 from a processing gas source 120 that is in fluid communication therewith. A substrate 122 may be loaded into, and removed from, the processing volume 110 through an opening (not shown) in the sidewall(s) 106, which is sealed with a slit valve (not shown) during plasma processing of the substrate 122.

The plasma processing system 100 includes a system controller 124. The system controller 124, which may also be referred to as a processing chamber controller, includes a central processing unit (CPU) 126, a memory 128, and support circuits 130. The system controller 124 is used to control the process sequence used to process the substrate 122. The CPU 126 is a general-purpose computer processor configured for use in an industrial setting for controlling the processing chamber and sub-processors related thereto. The memory 128 described herein, which is generally non-volatile memory, may include random access memory, read-only memory, floppy or hard disk drive, or other suitable forms of digital storage, local or remote. The support circuits 130 are conventionally coupled to the CPU 126 and include cache, clock circuits, input/output subsystems, power supplies, and the like, and combinations thereof. Software instructions (program) and data can be coded and stored within the memory 128 for instructing a processor within the CPU 126. A software program (or computer instructions) readable by CPU 126 in the system controller 124 determines which tasks are performable by the components in the plasma processing system 100. Typically, the software program, which is readable by the CPU 126 in the system controller 124, includes code, which, when executed by the CPU 126, performs tasks relating to the plasma processing methods described herein. The program may include instructions that are used to control the various hardware and electrical components within the plasma processing system 100.

In some embodiments, the lid assembly 112 includes one or more inductively coupled plasma (ICP) assemblies, such as a first ICP assembly 132 and a second ICP assembly 134 positioned above (e.g, along the z-direction) the chamber lid 114. In this manner, the first ICP assembly 132 and the second ICP assembly 134 may both be positioned outside of the processing volume 110. As shown, the first ICP assembly 132 and the second ICP assembly 134 include coil 136 and coil 138, respectively. The first ICP assembly 132 includes a first radio frequency source 140 configured to drive coil 136 such that the coil 136 inductively couples a radio frequency waveform generated by the first radio frequency source 140 to the plasma 116 formed in the processing volume 110 during plasma processing. Likewise, the second ICP assembly 134 includes a second radio frequency source 142 configured to drive coil 138 such that the coil 138 inductively couples a radio frequency waveform generated by the second radio frequency source 142 to the plasma 116 formed in the processing volume 110 during plasma processing. Embodiments of the disclosure include a plasma processing system 100 that includes the one or more inductively coupled plasma (ICP) assemblies included with the junction box enclosure configurations disclosed herein, such as the configurations illustrated and discussed in relation to FIGS. 2-8F.

In some embodiments, the chamber lid 114 includes a dielectric material that is configured to allow the fields generated by the coils 136, 138 during the delivery of an asymmetric voltage waveform by the first radio frequency source 140 and the second radio frequency source 142, respectively, to help generate and sustain the plasma 116 in the processing volume 110.

The plasma processing system 100 includes a substrate support assembly 144. The substrate support assembly 144 includes a substrate support 146 (e.g., electrostatic chuck) and one or more lower electrodes, such as a bias electrode 148 and/or an edge control electrode 150 that are formed within the substrate support 146.

In some embodiments, the substrate support assembly 144 includes a radio frequency baseplate 152, an insulator plate 154 and a ground plate 156. The radio frequency baseplate 152 may be electrically isolated from the chamber base 108 by the insulator plate 154. In addition, the ground plate 156 may be interposed between the insulator plate 154 and the chamber base 108. The substrate support 146 may be thermally coupled to and disposed on the radio frequency baseplate 152. In some embodiments, the radio frequency baseplate 152 is configured to regulate the temperature of the substrate support 146, and the substrate 122 disposed on the substrate support 146, during substrate processing.

The substrate support 146 is typically formed of a dielectric material, such as a bulk sintered ceramic material, such as a corrosion-resistant metal oxide or metal nitride material, for example, aluminum oxide ($Al_2O_3$), aluminum nitride (AlN), titanium oxide (TiO), titanium nitride (TiN), yttrium oxide ($Y_2O_3$), mixtures thereof, or combinations thereof. In embodiments herein, the substrate support 146 further includes the bias electrode 148 embedded in the dielectric material thereof.

In some embodiments, the bias electrode 148 may be a chucking pole used to secure (i.e., chuck) the substrate 122 to a substrate supporting surface 146A of the substrate support 146 and to bias the substrate 122 with respect to the processing of the plasma 116. Typically, the bias electrode

148 is formed of one or more electrically conductive parts, such as one or more metal meshes, foils, plates, or combinations thereof. Thus, the bias electrode 148 may also be referred to as a mesh electrode.

As discussed above, in some embodiments, the substrate support assembly 144 includes the edge control electrode 150 that is positioned below an edge ring 160 of the plasma processing system 100. The edge control electrode 150 may surround the bias electrode 148 and/or is disposed a distance from a center of the bias electrode 148. In general, if the processing chamber 102 is configured to process circular substrates, the edge control electrode 150 is annular in shape, is made from a conductive material, and is configured to surround at least a portion of the bias electrode 148. In some embodiments, the edge control electrode 150 is positioned within a region of the substrate support 105. In some embodiments, the edge control electrode 150 includes a conductive mesh, foil, and/or plate that is disposed a similar distance (i.e., Z-direction) from the substrate supporting surface 146A of the substrate support 146 as the bias electrode 148. In some other embodiments, the edge control electrode 150 includes a conductive mesh, foil, and/or plate that is positioned on or within a region of a quartz pipe 162 of the processing chamber 102, which surrounds at least a portion of the bias electrode 148 and/or the substrate support 146. Alternately, in some other embodiments (not shown), the edge control electrode 150 is positioned within or is coupled to the edge ring 160, which is disposed on and adjacent to the substrate support 146. In this configuration, the edge ring 160 is formed from a semiconductor or dielectric material (e.g., AlN, etc.).

In some embodiments, the quartz pipe 162 that at least partially circumscribes portions of the substrate support assembly 144 to prevent the substrate support 146 and/or the radio frequency baseplate 152 from coming in contact with corrosive processing gases or plasma, cleaning gases or plasma, or byproducts thereof. Typically, the quartz pipe 162, the insulator plate 154, and the ground plate 156 are circumscribed by a liner 164. In some embodiments, a plasma screen 166 is positioned between the liner 164 and the sidewall(s) 106 to prevent plasma from forming in a volume underneath the plasma screen 166 between the liner 164 and the sidewall(s) 106.

The plasma processing system 100 includes a radio frequency bias source 168. In some embodiments, radio frequency power (e.g., from the radio frequency bias source 168) for plasma production may be delivered to the radio frequency baseplate 152. In some embodiments, a frequency of the radio frequency power may be greater than 1 megahertz (MHz) but less than 200 MHz, such as about 13.56 MHz, and may be delivered to the radio frequency baseplate 152 through a radio frequency matching circuit 176. For instance, the radio frequency power may only be provided for a short interval during the initial generation of the plasma 116 in the processing volume 110.

The plasma processing system 100 includes a pulsed voltage source 170. The pulsed voltage source 170 may be configured to bias the bias electrode 148 of the substrate support assembly 144. Alternatively, or additionally, the pulsed voltage source 170 may be configured to bias the radio frequency baseplate 152. In some embodiments, a pulsed voltage waveform generated by the pulsed voltage source 170 and provided to the bias electrode 148, the radio frequency baseplate 152, or both may range from about 100 kilohertz (kHz) to about 1 MHz, such as between about 100 kHz and about 500 KHz.

The plasma processing system 100 may include a high voltage direct current power source 172 configured to deliver a clamping voltage (e.g., about-5,000 Volts to about +5,000 Volts) to the bias electrode.

Figure 1B:
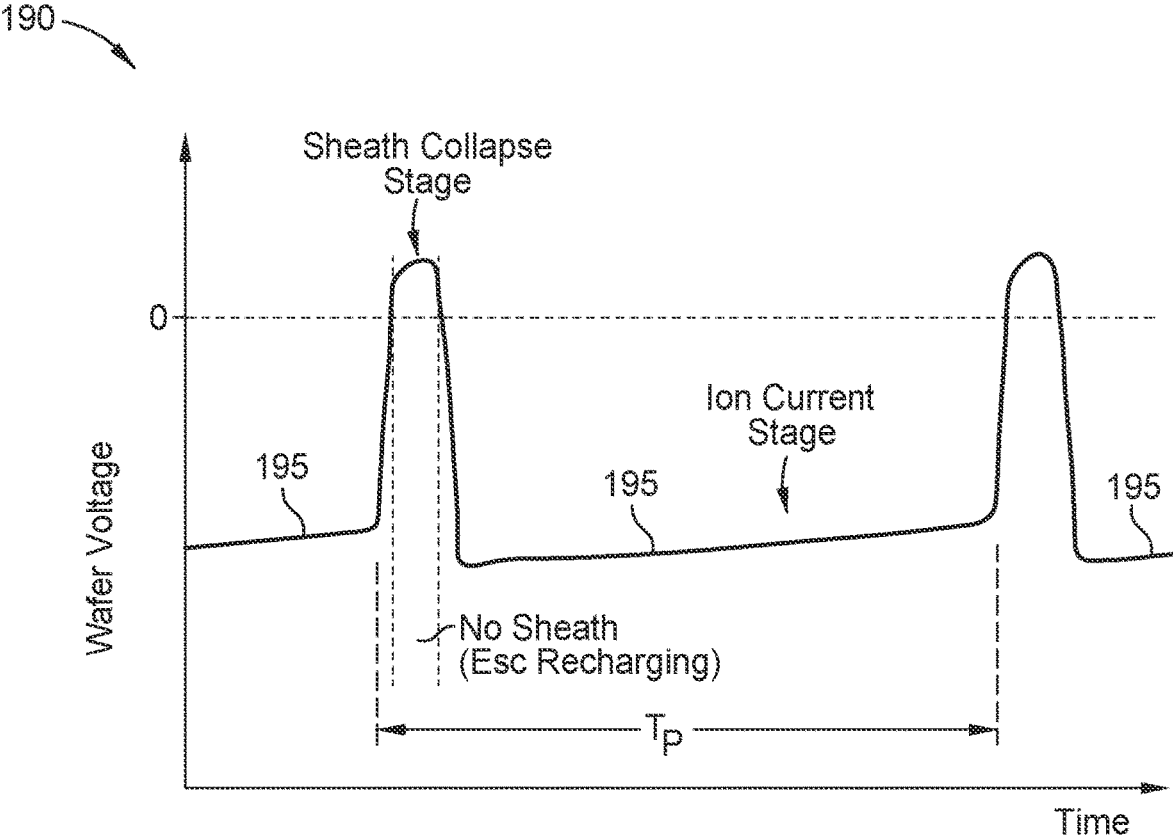
FIG. 1B depicts a graph of a voltage waveform that is established on a substrate due to a voltage waveform applied to an electrode within a processing chamber, in accordance with certain embodiments of the present disclosure.

FIG. 1B illustrates a graph 190 of a typical voltage waveform established at a substrate disposed on the substrate supporting surface (e.g., upper surface) of the substrate support assembly 144 of the plasma processing system 100 due to the delivery of pulsed voltage waveforms to the bias electrode 148 by the pulsed voltage source 170. A first waveform (e.g., a pulsed voltage waveform 195) is an example of a non-compensated pulsed voltage waveform established at the substrate during plasma processing. The pulsed voltage waveform cycle of the waveform 195 has a period $T_p$, which is, for example, typically between 2 microsecond (μs) and 10 μs, such as 2.5 μs. The ion current stage of the pulsed voltage waveform cycle will typically take up between about 50% and about 95% of the period $T_p$, such as from about 80% to about 90% of the period $T_p$.

The pulsed voltage waveform 195 includes two main stages: an ion current stage and a sheath collapse stage. Both portions (e.g., the ion current stage and the sheath collapse stage) of the pulsed voltage waveforms 195, can be alternately and/or separately established at the substrate during the plasma processing. At a beginning of the ion current stage, a drop in the voltage at the substrate is created, due to the delivery of a negative portion of the pulsed voltage waveform (e.g., the ion current portion) provided to the bias electrode 148 by the pulsed voltage source 170, which creates a high voltage sheath above the substrate. The high voltage sheath allows the plasma generated positive ions to be accelerated towards the biased substrate during the ion current stage, and thus, for RIE processes, controls the amount and characteristics of the etching process that occurs on the surface of the substrate during the plasma processing. The sheath collapse stage includes a positive voltage swing (e.g., as a result of the positive wafer voltage), and the ion current stage includes a negative voltage swing (e.g., as a result of the positive wafer voltage), as illustrated in FIG. 1B.

In some embodiments, the radio frequency bias source 168, the pulsed voltage source 170, and the high voltage direct current power source 172 may each be coupled to the electrode(s) via a single power delivery line 174. The power delivery line 174 may include: (a) a coaxial cable, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e).

Figure 5:
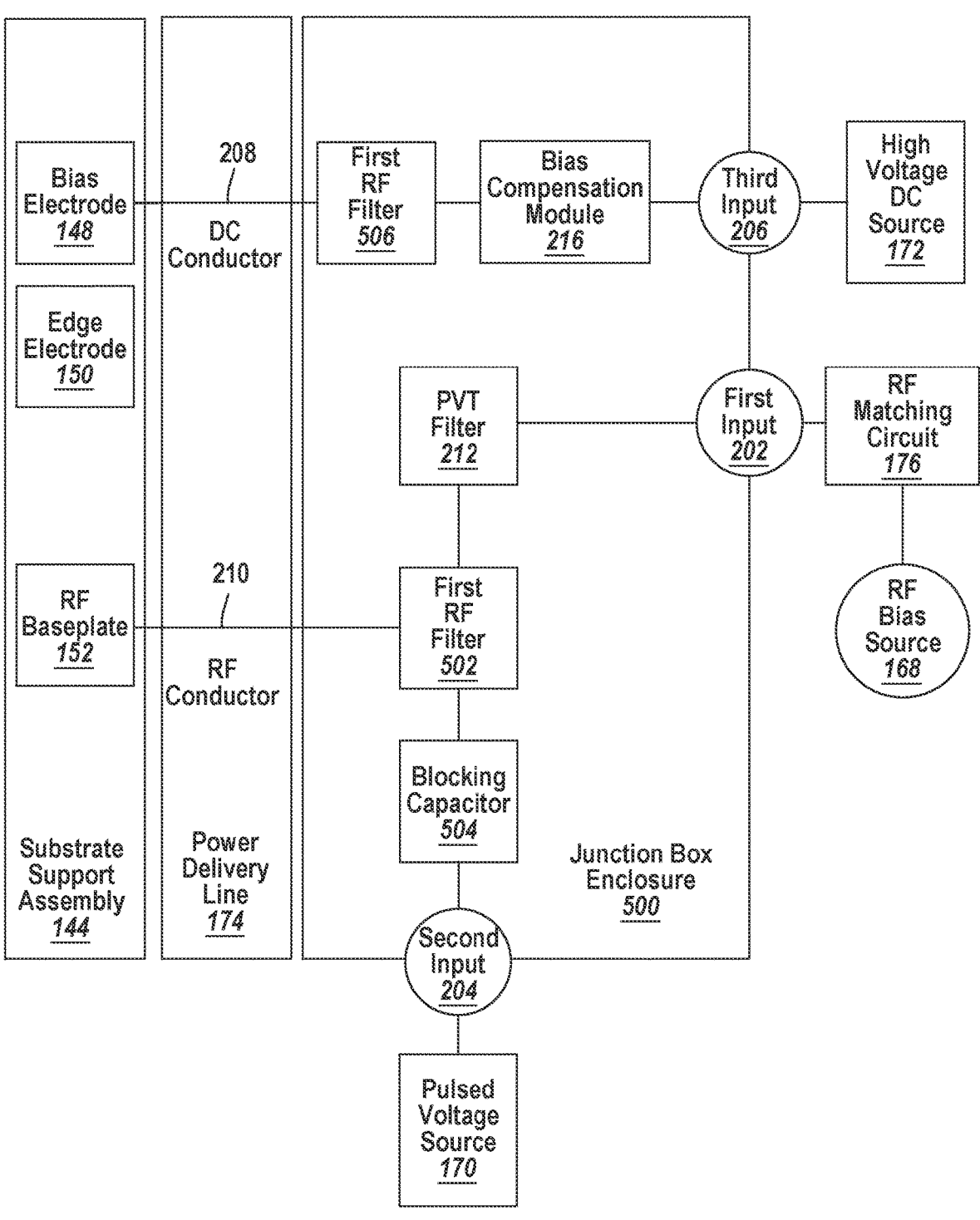
FIG. 5 depicts a junction box enclosure electrically coupling a pulsed voltage source and a radio frequency bias source to a radio frequency baseplate of a substrate support assembly according to some embodiments of the present disclosure.
Figure 6A:
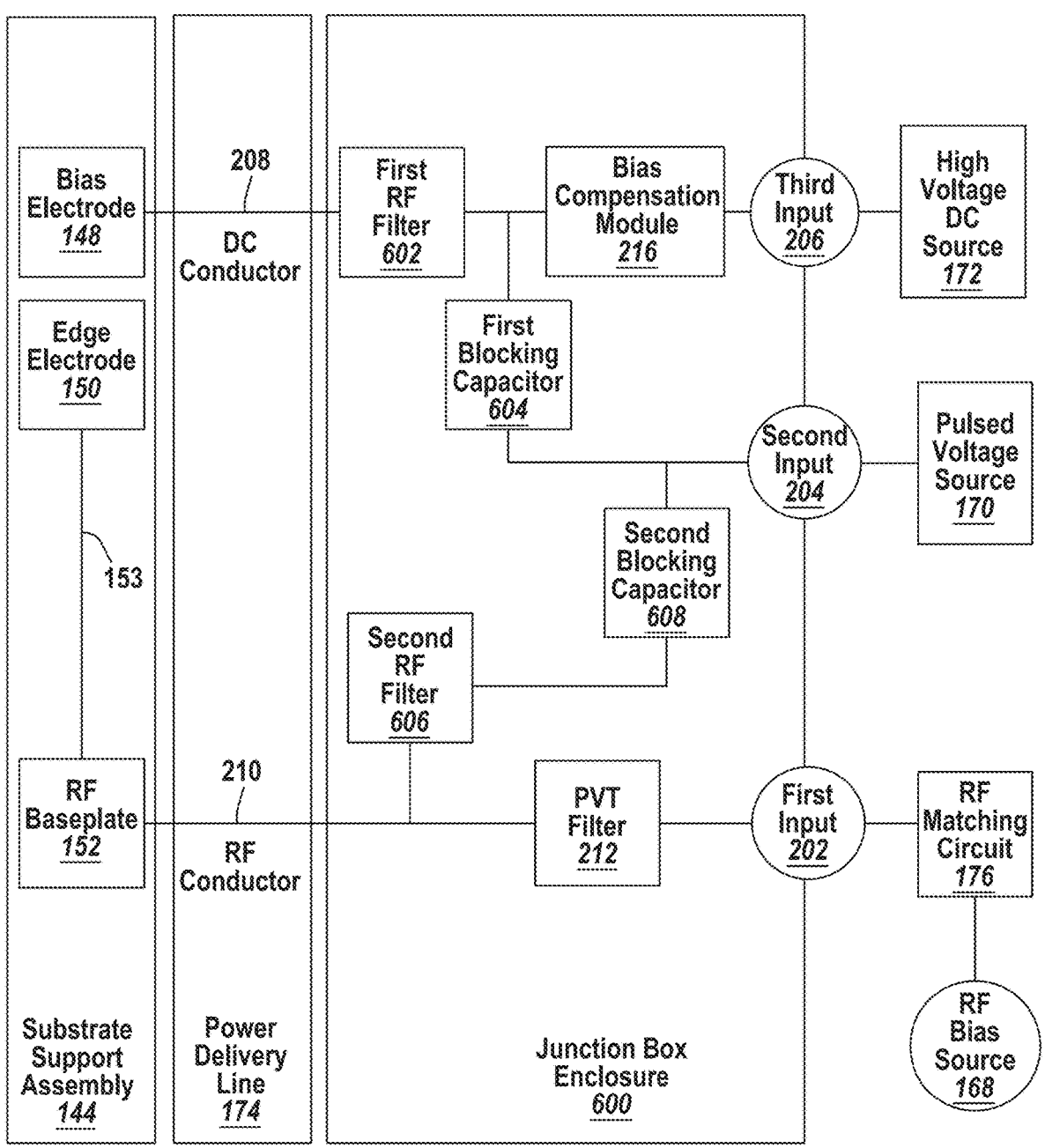
FIGS. 6A-6C depict different embodiments of a junction box enclosure electrically coupling a pulsed voltage source to an electrode of a substrate support of a substrate support assembly and further electrically coupling the pulsed voltage source to a radio frequency baseplate of the substrate support assembly according to some embodiments of the present disclosure.
Figure 6B:
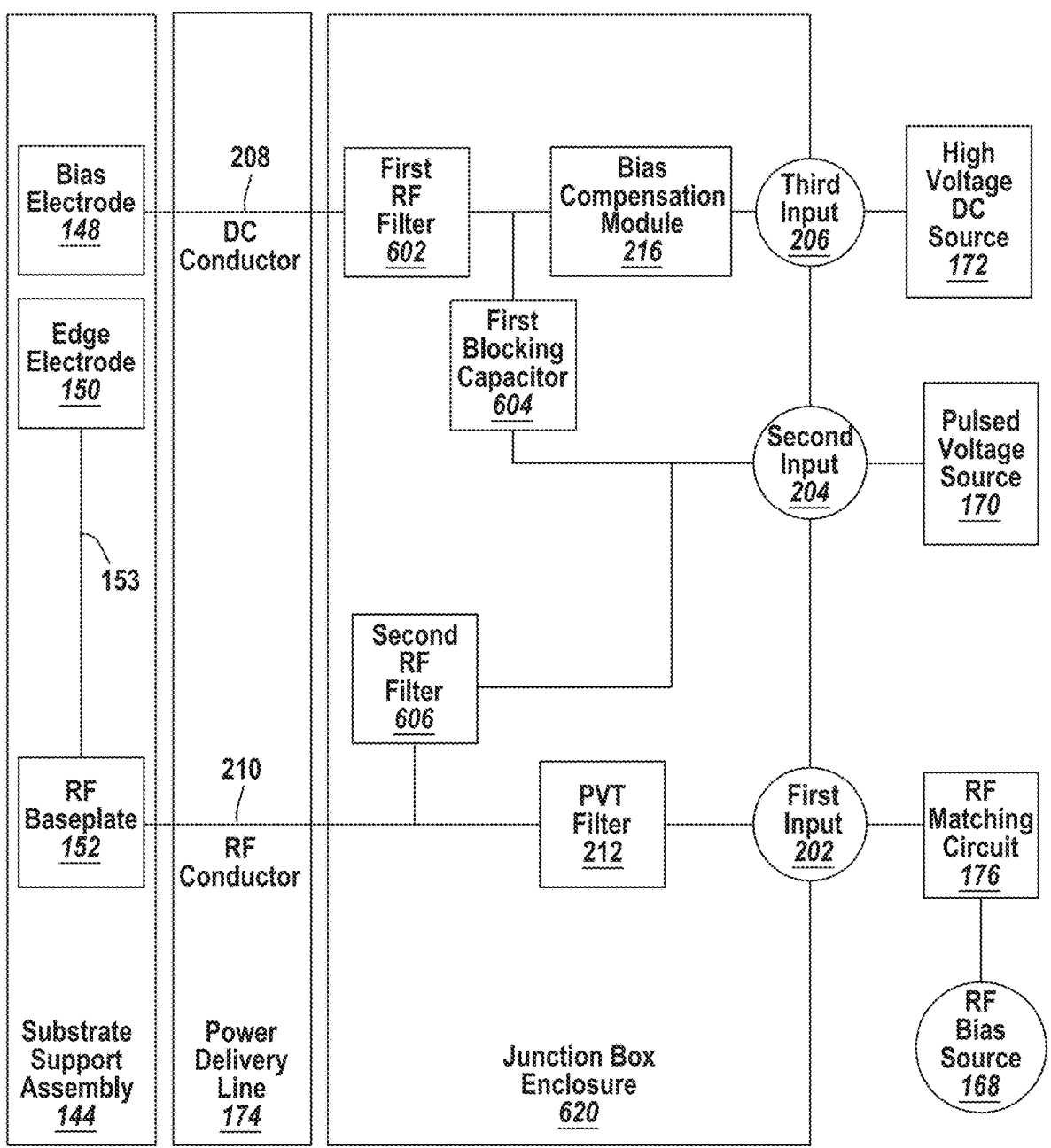
Figure 6C:
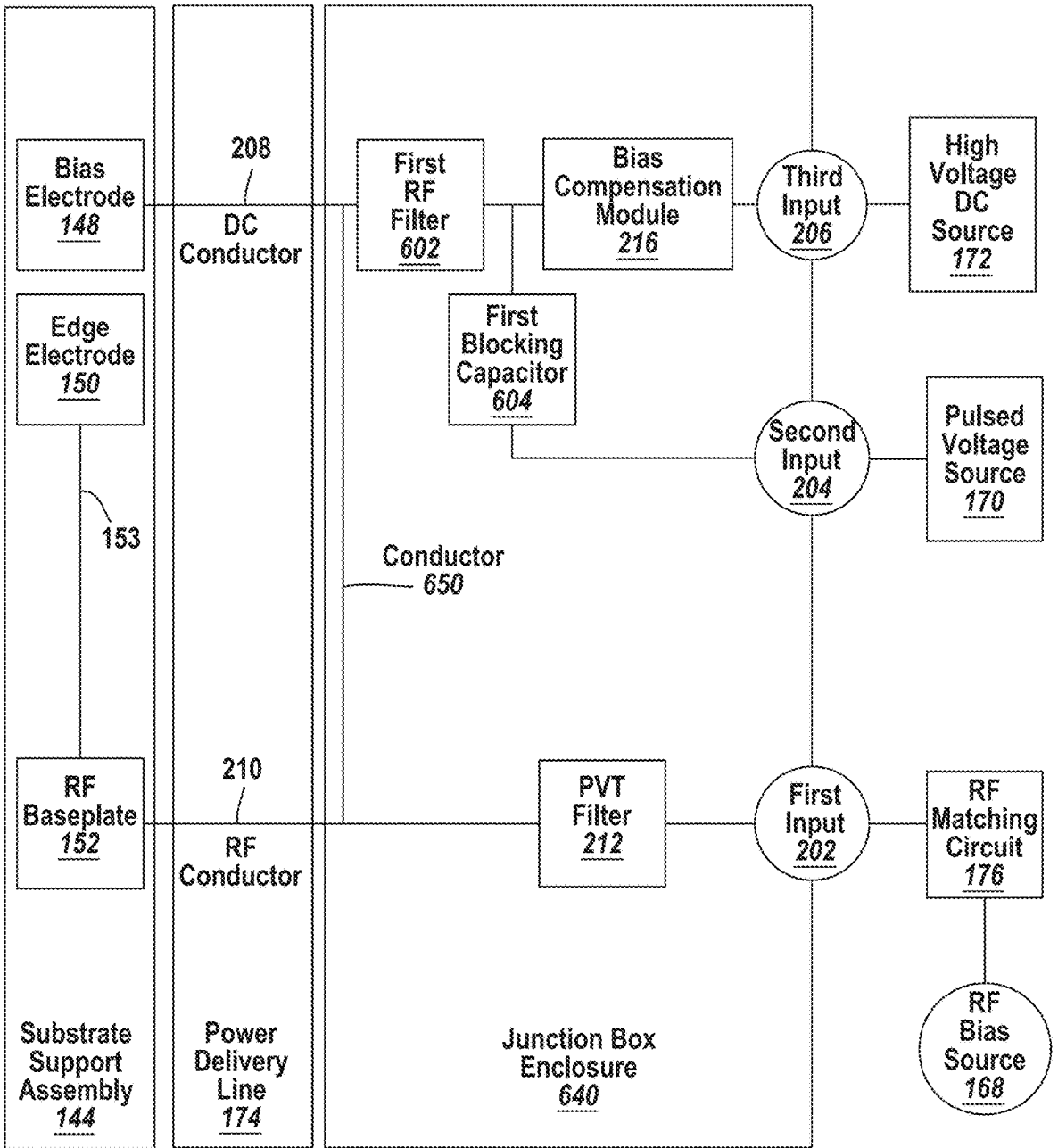

The plasma processing system 100 includes a junction box enclosure 180 coupled to each of the radio frequency bias source 168, the pulsed voltage source 170, and the high voltage direct current power source 172. For instance, the junction box enclosure 180 may include three separate inputs, such as a first input coupled to the radio frequency bias source 168, a second input coupled to the pulsed voltage source 170, and a third input coupled to the high voltage direct current power source 172. The junction box enclosure 180 may, for example, be configured to couple the pulsed voltage source 170 to the bias electrode 148 (e.g., as illustrated in FIG. 2), the radio frequency baseplate (e.g., as illustrated in FIG. 5), or both (e.g., as illustrated in FIGS. 6A-6C).

Example Junction Box Enclosure Configuration

Figure 2:
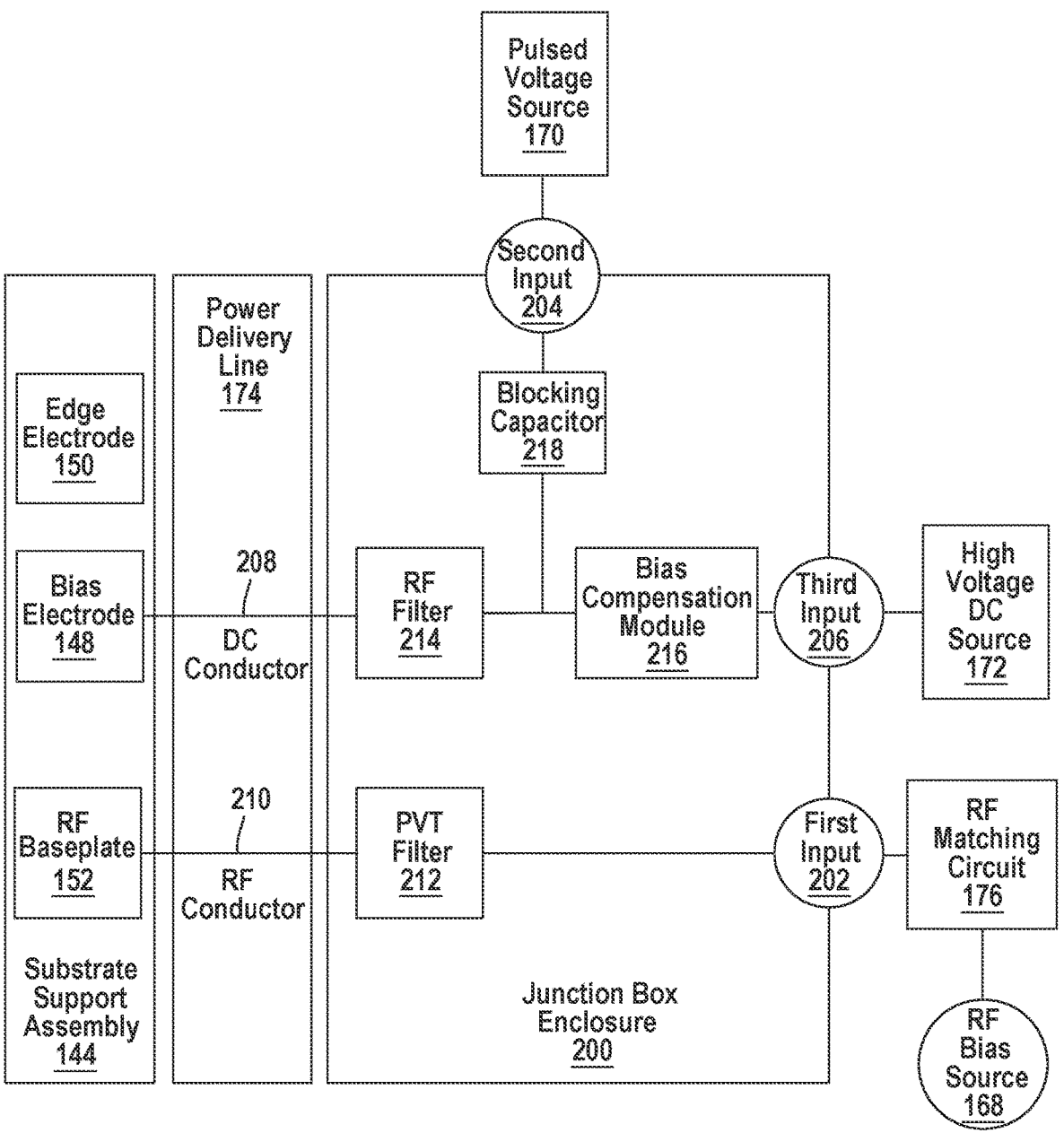
FIG. 2 depicts a junction box enclosure electrically coupling a pulsed voltage waveform to an electrode of a substrate support of a substrate support assembly and further electrically coupling a radio frequency bias source to a radio frequency baseplate of the substrate support assembly according to some embodiments of the present disclosure.

FIG. 2 illustrates components of a junction box enclosure 200 according to an embodiment of the present disclosure.

The junction box enclosure 200 may be used in the plasma processing system 100 discussed above with reference to FIG. 1A. For instance, the junction box enclosure 200 may be junction box enclosure 180.

The junction box enclosure 200 electrically couples the pulsed voltage source 170 to the bias electrode 148 of the substrate support assembly 144 via the power delivery line 174 so that the bias electrode 148 may be driven by the pulsed voltage waveform. Additionally, the junction box enclosure 200 couples the radio frequency bias source 168 to the radio frequency baseplate 152 so that radio frequency waveform generated by the radio frequency bias source 168 may be delivered to the radio frequency baseplate 152. Details of the junction box enclosure 200 will now be discussed.

The junction box enclosure 200 includes multiple inputs. For instance, the junction box enclosure 180 includes a first input 202 coupled to the radio frequency bias source 168. The junction box enclosure 200 also includes a second input 204 coupled to the pulsed voltage source 170 and a third input 206 coupled to the high voltage direct current power source 172.

The junction box enclosure 200 includes a single output coupled to the power delivery line 174 that, as discussed above with reference to plasma processing system 100 of FIG. 1A, may be used to deliver power (e.g., radio frequency and direct current) to the bias electrode 148 and the radio frequency baseplate 152 (e.g., labeled RF baseplate). More specifically, the output of the junction box enclosure 200 may be coupled to the bias electrode 148 (e.g., associated with the electrostatic chuck of the plasma processing system 100) via a direct current conductor 208 (e.g., labeled DC conductor) of the power delivery line 174. The output of the junction box enclosure 180 may also be coupled to the radio frequency baseplate 152 via a radio frequency conductor 210 of the power delivery line 174.

In some embodiments, the biasing electrode 148 is spaced apart from the substrate receiving surface 146A of the substrate support 146 of the substrate support assembly 144, and thus from the substrate 122, by a layer of dielectric material of the substrate support 146. In some embodiments, the substrate support 146 includes an electrostatic chuck (ESC) that is a coulombic ESC or a Johnsen-Rahbek ESC. In general, a parallel plate like structure is formed by the biasing electrode 148 and the layer of the dielectric material that can typically have an effective capacitance $C_E$ of between about 5 nF and about 50 nF, such as between about 7 and about 10 nF, for example. Typically, the layer of dielectric material (e.g., aluminum nitride (AlN), aluminum oxide ($Al_2O_3$), etc.) has a thickness between about 0.1 mm and about 1 mm, such as between about 0.1 mm and about 0.5 mm, for example about 0.3 mm.

Referring to FIGS. 1A and 2, in some embodiments, an RF baseplate 152 is spaced apart from the biasing electrode 148 by a portion of dielectric material. The portion of dielectric material in some configurations is the dielectric material used to form the substrate support assembly 144, and extends from the backside of the substrate support 146 to the biasing electrode 148. The portion of dielectric material of the substrate support 146 has a support base capacitance $C_{CL}$ that is in series with the ESC capacitance $C_E$. In some embodiments, the thickness of the portion of the dielectric material disposed between the RF baseplate 152 and the biasing electrode 148 is greater than the thickness of the dielectric material disposed between the biasing electrode 148 and the substrate 122, wherein the dielectric materials are the same material and/or form part of the substrate support 146. In one example, the portion of a dielectric material of the substrate support 146 (e.g., $Al_2O_3$ or AlN) disposed between RF baseplate 152 and the biasing electrode 148 is greater than 1 mm thick, such as between about 1.5 mm and about 20 mm thick.

In the illustrated embodiment, a pulsed voltage waveform generated by the pulsed voltage source 170 and/or high voltage direct current power generated by the high voltage direct current power source 172 may be delivered to the bias electrode 148 via the direct current conductor 208 of the power delivery line 174. Conversely, a radio frequency waveform generated by the radio frequency bias source 168 may be delivered to the radio frequency baseplate 152 via the radio frequency conductor 210.

Since the radio frequency bias source 168 and the pulsed voltage source 170 are both coupled to the power delivery line 174 and generate waveforms of different frequencies (e.g., 2 MHz to 200 MHz radio frequency waveform vs. about 100 kHz-2 MHz pulsed voltage waveform), the junction box enclosure 200 includes dedicated filter circuits to prevent a waveform from one source coupled into another source. Details of the dedicated filter circuit will now be discussed.

The junction box enclosure 180 includes a pulsed voltage filter circuit 212 (e.g., labeled PVT Filter) coupled between the radio frequency bias source 168 and the radio frequency conductor 210 of the power delivery line 174. The pulsed voltage filter circuit 212 may be configured to pass a radio frequency waveform generated by the radio frequency bias source 168 and filter (e.g., block) a pulsed voltage waveform generated by the pulsed voltage source 170. In this manner, the pulsed voltage filter circuit 212 may prevent the pulsed voltage waveform from coupled into the radio frequency bias source 168. It should be appreciated that the pulsed voltage filter circuit 212 may also isolate the radio frequency bias source 168 from the high voltage direct current power source 172 by filtering (e.g., blocking) a high voltage direct current waveform generated by the high voltage direct current power source 172.

The junction box enclosure 180 includes a radio frequency filter circuit 214 (e.g., labeled RF Filter) coupled between the pulsed voltage source 170 and the direct current conductor 208 of the power delivery line 174. The radio frequency filter circuit 214 may be configured to pass a pulsed voltage waveform generated by the pulsed voltage source 170 and filter (e.g., block) a radio frequency waveform generated by the radio frequency bias source 168. In this manner, the radio frequency filter circuit 214 may prevent the radio frequency waveform from coupled into the pulsed voltage source 170. It should be appreciated that the radio frequency filter circuit 214 may also isolate the high voltage direct current power source 172 from the radio frequency bias source 168 by filtering (e.g., blocking) the radio frequency waveform generated by the radio frequency bias source 168.

In some embodiments, the junction box enclosure 200 may include a bias compensation module 216 coupled between the radio frequency filter circuit 214 and the high voltage direct current power source 172. The bias compensation module 216 may be configured to stabilize the direct current voltage being applied to the bias electrode 148 (e.g., via the direct current conductor 208 of the bias electrode 148).

In some embodiments, the junction box enclosure 200 may include a blocking capacitor 218 coupled between the pulsed voltage source 170 and the radio frequency filter circuit 214. In this manner, the blocking capacitor 218 may further isolate the pulsed voltage source 170 from the radio frequency bias source 168 by blocking radio frequency waveforms that may not be filtered by the radio frequency filter circuit 214.

Example Pulsed Voltage Filter Circuit and Radio Frequency Filter Circuit

Figure 3A:
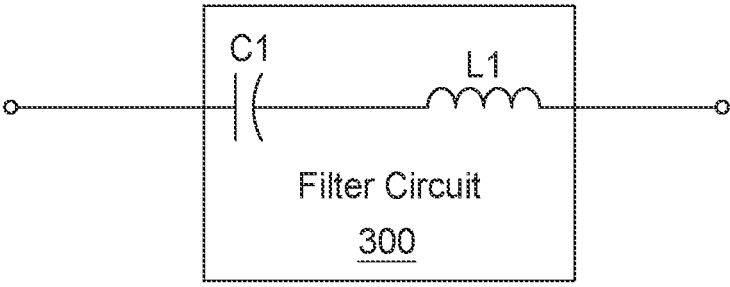
FIG. 3A depicts a circuit diagram of a pulsed voltage filter circuit for a junction box enclosure according to some embodiments of the present disclosure.

FIG. 3A illustrates a circuit schematic of a filter circuit 300 according to some embodiments of the present disclosure. The filter circuit 300 may be used in the junction box enclosure 200 discussed above with reference to FIG. 2. For instance, the filter circuit 300 may be implemented as the pulsed voltage filter circuit 212 of the junction box enclosure 200.

As shown, the filter circuit 300 may be a band pass filter. More specifically, the filter circuit 300 may be a second-order bandpass filter that includes a first capacitor C1 and a first inductor L1 in a series arrangement. It should be understood that the filter circuit 300 is not limited to the configuration shown in FIG. 3A and therefore may be configured in any suitable manner.

Figure 3B:
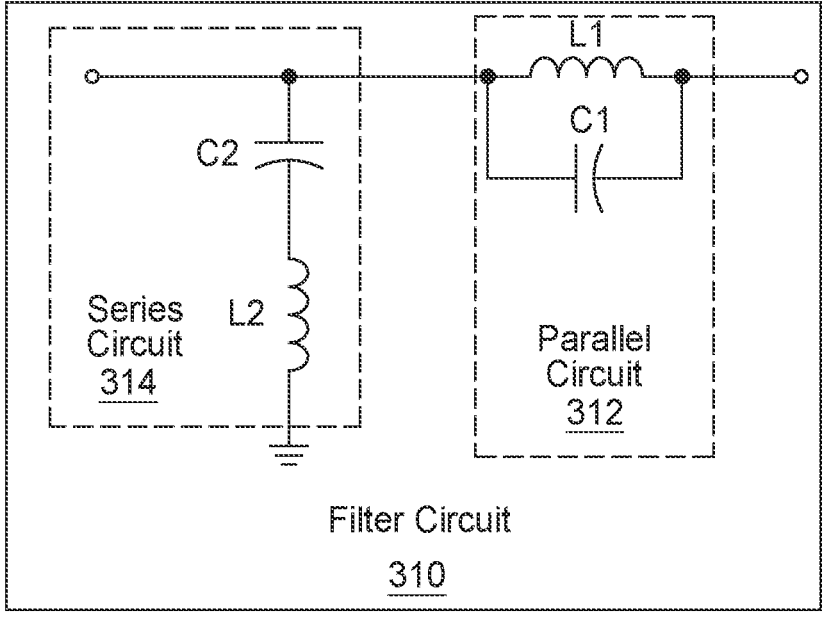
FIG. 3B depicts a circuit diagram of a radio frequency filter circuit for a junction box enclosure according to some embodiments of the present disclosure.

FIG. 3B illustrate a circuit schematic of another filter circuit 310 according to some embodiments of the present disclosure. The filter circuit 310 may be used in the junction box enclosure 200 discussed above with reference to FIG. 2. For instance, the filter circuit 310 may be implemented as the radio frequency filter circuit 214 of the junction box enclosure 200.

In some embodiments, the filter circuit 310 may be configured as a bandstop filter. For instance, the filter circuit 310 may include a parallel circuit 312 and/or a series circuit 314 coupled in parallel with the parallel circuit 312. The parallel circuit 312 includes a first inductor L1 and a first capacitor C1. The series circuit 314 includes a second capacitor C2 and a second inductor L2. By using those circuits, the filter circuit 310 exhibits a narrower bandwidth and greater selectivity. Additionally, this arrangement can provide for impedance matching as the parallel circuit 312 can provide a complimentary impedance to the series circuit 314 resulting in better impedance matching.

Frequency Response of Filter Circuits for Junction Box Enclosure

Figure 4A:
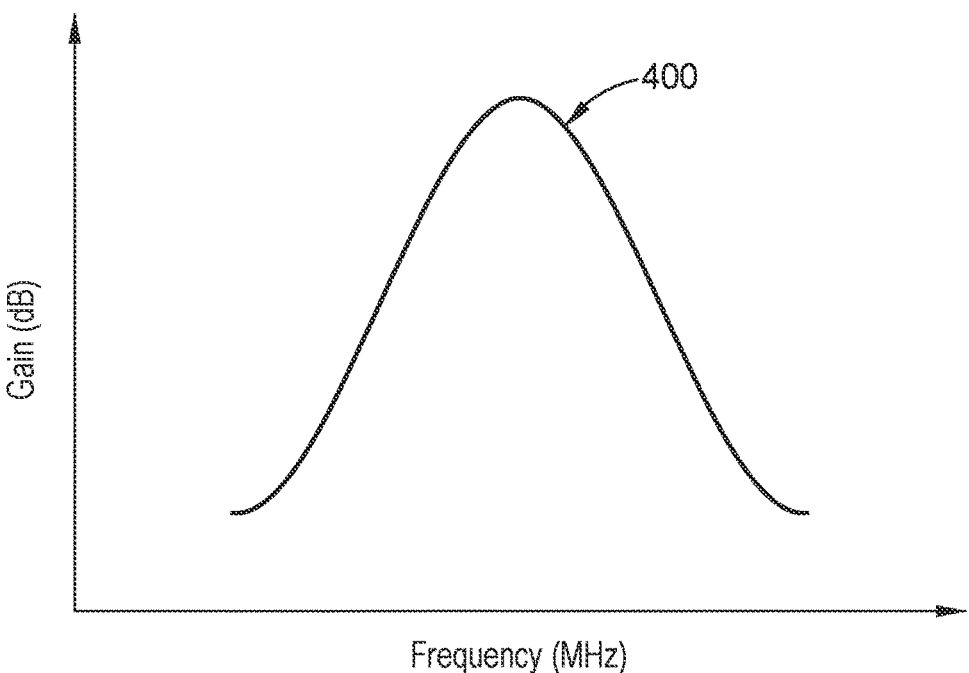
FIG. 4A depicts a graphical representation of a frequency response for the pulsed voltage filter circuit of FIG. 3A according to some embodiments of the present disclosure.

FIG. 4A illustrates a graphical representation of a frequency response 400 of the pulsed voltage filter circuit 212 (e.g., illustrated in FIG. 2) according to some embodiments of the present disclosure. In particular, the graphical representation illustrates a gain (e.g., denoted along the vertical axis in decibels) of the pulsed voltage filter circuit 212 as a function of frequency. A difference between the gain of the pulsed voltage filter circuit 212 at frequencies (e.g., up to 2 MHZ) associated with the pulsed voltage waveform generated by the pulsed voltage source 170 (e.g., illustrated in FIG. 2) and a gain of the pulsed voltage filter circuit 212 at a frequency (e.g., about 13 MHZ) of the radio frequency waveform generated by the radio frequency bias source 168 (e.g., illustrated in FIG. 2) is significant. For instance, in some embodiments the gain of the pulsed voltage filter circuit 212 at frequencies associated with the pulsed voltage waveform may be about −40 decibels, whereas the gain of the pulsed voltage filter circuit 212 at the frequency associated with the radio frequency waveform is about 0 decibels. Thus, the pulsed voltage filter circuit 212 filters (e.g., blocks) the pulsed voltage waveform (as well as the high voltage direct current waveform) and passes the radio frequency waveform.

Figure 4B:
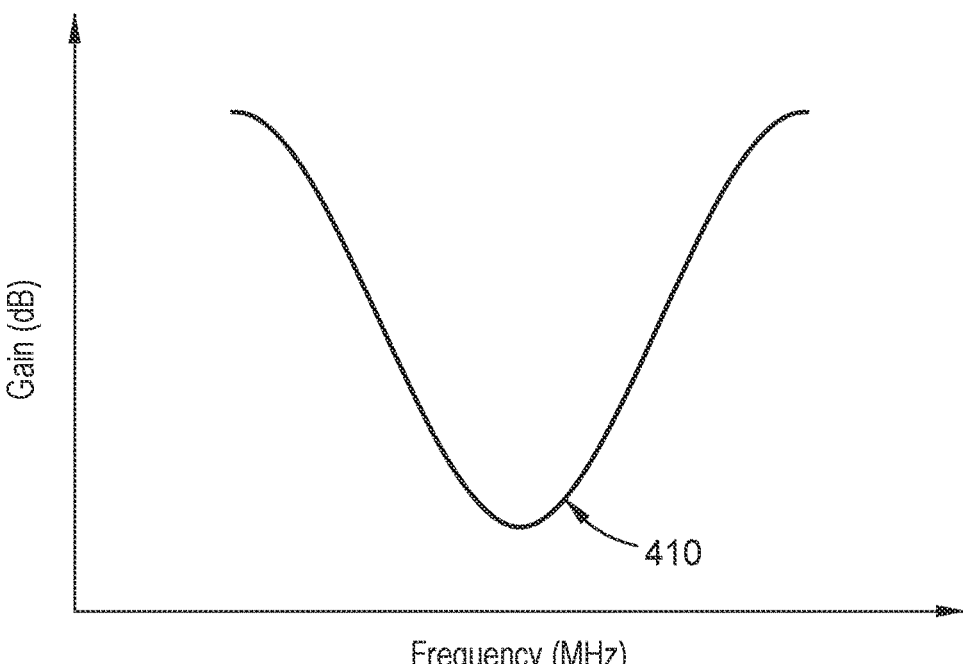
FIG. 4B depicts a graphical representation of a frequency response for the radio frequency filter circuit of FIG. 3B according to some embodiments of the present disclosure.

FIG. 4B illustrates a graphical representation of a frequency response 410 of the radio frequency filter circuit 214 (e.g., illustrated in FIG. 2) according to some embodiments of the present disclosure. In particular, the graphical representation illustrates a gain (e.g., denoted along the vertical axis in decibels) of the radio frequency filter circuit 214 as a function of frequency. A difference between the gain of the radio frequency filter circuit 214 at frequencies (e.g., up to 2 MHZ) associated with the pulsed voltage waveform generated by the pulsed voltage source 170 and a gain of the radio frequency filter circuit 214 at a frequency (e.g., 13 MHZ) of the radio frequency waveform generated by the radio frequency bias source 168 (e.g., illustrated in FIG. 1A) is significant. For instance, the gain of the radio frequency filter circuit 214 at frequencies associated with the pulsed voltage waveform may be about 0 decibels, whereas the gain of the radio frequency filter circuit 214 at the frequency associated with the radio frequency waveform may be about −40 decibels. Thus, the radio frequency filter circuit 214 filters (e.g., blocks) the radio frequency waveform and passes the radio frequency waveform (as well as the high voltage direct current waveform).

Example Junction Box Enclosure Coupling Pulsed Voltage Source to a Radio Frequency Baseplate of a Plasma Processing System FIG. 5 illustrates components of a junction box enclosure 500 according to another embodiment of the present disclosure. The junction box enclosure 500 may be similar to the junction box enclosure 200 discussed above with reference to FIG. 2. Therefore, components of the junction box enclosure 500 that were previously described with reference to FIG. 2 will retain the same reference numbers.

In contrast to the junction box enclosure 200 of FIG. 2, which couples only the radio frequency bias source 168 to the radio frequency baseplate 152, the junction box enclosure 500 of FIG. 5 couples both the radio frequency bias source 168 and the pulsed voltage source 170 to the radio frequency baseplate 152. In this manner, both the radio frequency waveform generated by the radio frequency baseplate 152 and the pulsed voltage waveform generated by the pulsed voltage source 170 may be delivered to the radio frequency baseplate 152.

The junction box enclosure 500 includes a first radio frequency filter circuit 502 coupled between the radio frequency conductor 210 and the pulsed voltage source 170. The first radio frequency filter circuit 502 may pass the pulsed voltage waveform generated by the pulsed voltage source 170 so that the pulsed voltage waveform may be delivered to the radio frequency baseplate 152. In addition, the first radio frequency filter circuit 502 may block (e.g., filter) the radio frequency waveform generated by the radio frequency bias source 168. In this manner, the first radio frequency filter circuit 502 may isolate the pulsed voltage source 170 from the radio frequency bias source 168 to prevent the radio frequency waveform generated by the radio frequency bias source 168 and also being delivered to the radio frequency baseplate 152 via the radio frequency conductor 210 of the power delivery line 174 from coupled into the pulsed voltage source 170.

In some embodiments, the junction box enclosure 500 may include a blocking capacitor 504 coupled between the pulsed voltage source 170 and the first radio frequency filter circuit 502. The blocking capacitor 504 may be configured to further isolate the pulsed voltage source 170 form the radio frequency bias source 168.

It should be understood that the pulsed voltage filter circuit 212 (e.g., labeled PVT filter) depicted in FIG. 5 may function in substantially the same manner as previously discussed with reference to FIG. 2. For instance, the pulsed voltage filter circuit 212 may isolate the radio frequency bias source 168 from the pulsed voltage source 170. More specifically, the pulsed voltage filter circuit 212 may filter (e.g., block) the pulsed voltage waveform generated by the pulsed voltage source 170 to prevent the pulsed voltage waveform from coupled into the radio frequency bias source 168.

It should also be understood that the pulsed voltage filter circuit 212 may isolate the radio frequency bias source 168 from the high voltage direct current power source 172. For instance, the pulsed voltage filter circuit 212 may filter (e.g., block) the high voltage direct current power generated by the high voltage direct current power source to prevent the high voltage direct current power from coupled into the radio frequency bias source 168.

The junction box enclosure 500 may include a second radio frequency filter circuit 506 coupled between the high voltage direct current power source 172 and the direct current conductor 208 of the power delivery line 174. The second radio frequency filter circuit 506 may be configured to isolate the high voltage direct current power source 172 from the radio frequency bias source 168 to prevent the radio frequency waveform generated by the radio frequency bias source 168 from coupled into the high voltage direct current power source 172.

Example Junction Box Enclosures Coupling Pulsed Voltage Source to DC and RF

FIGS. 6A, 6B, and 6C illustrate junction box enclosures 600 (FIG. 6A), 620 (FIG. 6B), and 640 (FIG. 6C) according to some embodiments of the present disclosure. More specifically, the junction box enclosures 600, 620, 640 represent different configurations for connecting the pulsed voltage source 170 to both the direct current conductor 208 of the power delivery line 174 and the radio frequency conductor 210 of the power delivery line 174 to simultaneously delivery the pulse waveform generated by the pulsed voltage source 170 to the bias electrode 148 and the radio frequency baseplate 152.

The junction box enclosures 600, 620, 640 may be similar to the junction box enclosures 200, 500 discussed above with reference to FIG. 2. Therefore, components of the junction box enclosures 600, 620, 640 that were previously described with reference to FIG. 2 will retain the same reference numbers. Details of the different junction box enclosures 600, 620, 640 will now be discussed in more detail.

The junction box enclosure 600 of FIG. 6A includes a first radio frequency filter circuit 602 coupled between the pulsed voltage source 170 and the direct current conductor 208 of the power delivery line 174. The first radio frequency filter circuit 602 may pass the pulsed voltage waveform generated by the pulsed voltage source 170 so that the pulsed voltage waveform may be delivered to the bias electrode 148. In addition, the first radio frequency filter circuit 602 may isolate the pulsed voltage source 170 from the radio frequency bias source 168 to prevent the radio frequency waveform generated by the radio frequency bias source 168 from coupled into the pulsed voltage source 170.

It should be appreciated that the first radio frequency filter circuit 602 may also be coupled between the high voltage direct current power source 172 and the direct current conductor 208 of the power delivery line 174. In this manner, the first radio frequency filter circuit 602 may isolated the high voltage direct current power source 172 from the radio frequency bias source 168 to prevent the radio frequency waveform generated by the radio frequency bias source 168 from coupled into the high voltage direct current power source 172.

In some embodiments, the junction box enclosure 600 may include a first blocking capacitor 604 coupled between the pulsed voltage source 170 and the first radio frequency filter circuit 602. The first blocking capacitor 604 may further isolate the pulsed voltage source 170 from the radio frequency bias source 168. For instance, the first blocking capacitor 604 may block a radio frequency waveform propagating along the direct current conductor 208 towards the pulsed voltage source 170. More specifically, if the first radio frequency filter circuit 602 does not filter (e.g., block) the radio frequency waveform, the first blocking capacitor 604 may block the radio frequency waveform and therefore prevent the radio frequency waveform from coupled into the pulsed voltage source 170.

The junction box enclosure 600 of FIG. 6A further includes a second radio frequency filter circuit 606 coupled between the pulsed voltage source 170 and the radio frequency conductor 210 of the power delivery line 174. The second radio frequency filter circuit 606 of the junction box enclosure 600 may pass the pulsed voltage waveform generated by the pulsed voltage source 170 so that the pulsed voltage waveform may be delivered to the radio frequency baseplate 152. In addition, the second radio frequency filter circuit 606 may isolate the pulsed voltage source 170 from the radio frequency bias source 168 to prevent the radio frequency waveform generated by the radio frequency bias source 168 and also being delivered to the radio frequency baseplate 152 via the radio frequency conductor 210 of the power delivery line 174 from coupled into the pulsed voltage source 170.

In some embodiments, the junction box enclosure 600 may include a second blocking capacitor 608 coupled between the pulsed voltage source 170 and the second radio frequency filter circuit 606. The second blocking capacitor 608 may further isolate the pulsed voltage source 170 from the radio frequency bias source 168. For instance, the second blocking capacitor 608 may block a radio frequency waveform propagating along the radio frequency conductor 210 towards the pulsed voltage source 170. More specifically, if the second radio frequency filter circuit 606 does not filter (e.g., block) the radio frequency waveform, the second blocking capacitor 608 may block the radio frequency waveform and therefore prevent the radio frequency waveform from coupled into the pulsed voltage source 170.

The junction box enclosure 620 of FIG. 6B is substantially similar to the junction box enclosure 610 of FIG. 6A. For instance, the junction box enclosure 620 of FIG. 6B includes the first radio frequency filter circuit 602, the first blocking capacitor 604, and the second radio frequency filter circuit 606. However, in contrast to the junction box enclosure 600 of FIG. 6A, the junction box enclosure of FIG. 6B does not include the second blocking capacitor 608. In this manner, the junction box enclosure 620 illustrates that the second blocking capacitor 608 discussed above with reference to the junction box enclosure 600 of FIG. 6A may be optional.

The junction box enclosure 640 of FIG. 6C is substantially similar to the junction box enclosure of FIG. 6B. For instance, the junction box enclosure 640 of FIG. 6C includes the first radio frequency filter circuit 602 and the first blocking capacitor 604. However, in contrast to the junction box enclosure 620 of FIG. 6B, the junction box enclosure 640 of FIG. 6C does not include the second radio frequency filter circuit 606. Instead, the junction box enclosure 640 of FIG. 6C includes a conductor 650 (e.g., a wire) coupled between the direct current conductor 208 of the power delivery line 174 and the radio frequency conductor 210 of the power delivery line 174. In this manner, the conductor 650 provides an electrical path from the pulsed voltage source 170 to the radio frequency conductor 210 of the power delivery line 174 so that the pulsed voltage waveform generated by the pulsed voltage source 170 may, in addition to being delivered to the bias electrode via the direct current conductor 208 of the power delivery line 174, also be delivered to the radio frequency baseplate 152.

As shown in FIGS. 6A, 6B, and 6C, the substrate support assembly 144 may, in some embodiments, include a conductor 153 coupling (e.g., directly coupling) the radio frequency baseplate 152 of the substrate support assembly 144 to the edge control electrode 150 of the substrate support assembly 144. In this manner, the pulsed voltage waveform generated by the pulsed voltage source 170 and delivered to the radio frequency baseplate 152 via the radio frequency conductor 210 of the power delivery line 174 may be further delivered to the edge control electrode 150 via the conductor 153 coupling the radio frequency baseplate 152 to the edge control electrode 150.

Additional Configurations for a Pulsed Voltage Filter Circuit

Figure 7A:
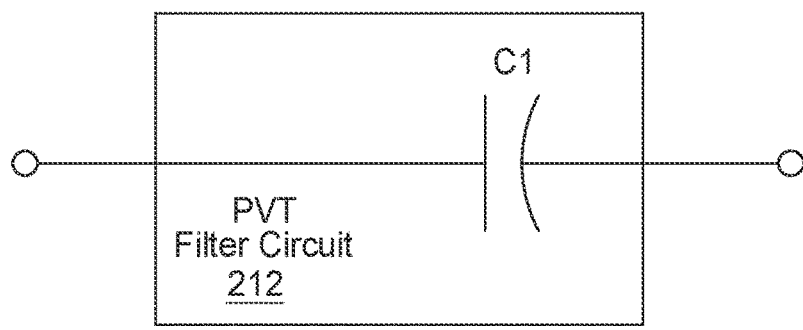
FIGS. 7A-7C depict different pulsed voltage filter circuits for a junction box enclosure according to some embodiments of the present disclosure.
Figure 7B:
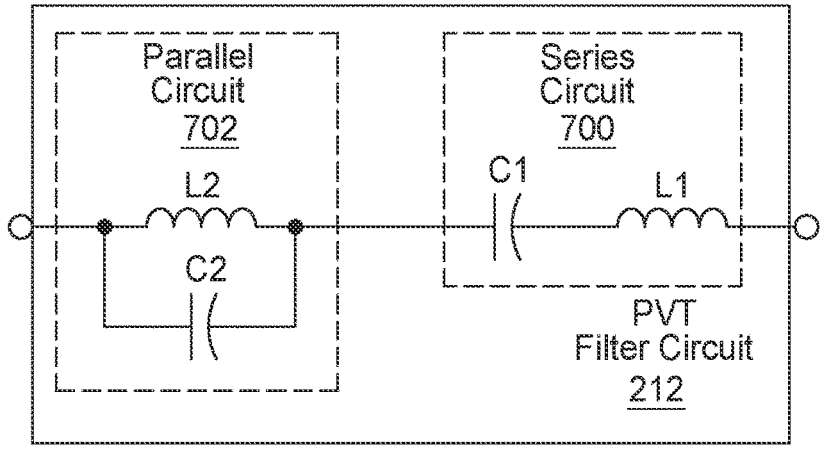
Figure 7C:
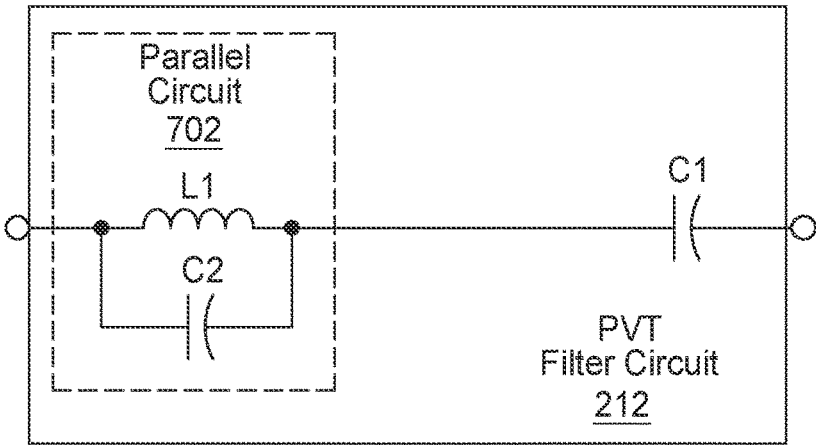

FIGS. 7A-7C illustrate alternative circuit designs for the pulsed voltage filter circuit 212 of the junction box enclosures discussed above with reference to FIGS. 2, 5, and 6A-6C according to some embodiments of the present disclosure. For instance, FIG. 7A illustrates a first embodiment of the pulsed voltage filter circuit 212 in which a single capacitor C1 (e.g., a blocking capacitor) is implemented to block the pulsed voltage waveform generated by the pulsed voltage source 170.

FIG. 7B illustrates a second embodiment of the pulsed voltage filter circuit 212 in which the pulsed voltage filter circuit 212 includes a series circuit 700 that includes a capacitor C1 and an inductor L1 coupled in series with the capacitor C1. The series circuit 700 allows the radio frequency waveform generated by the radio frequency bias source 168 (FIG. 1A) to pass. In addition, the series circuit 700 filters (e.g., blocks) the pulsed voltage waveform from coupling back into the radio frequency bias source 168.

The pulsed voltage filter circuit of FIG. 7B also includes a parallel circuit 702. The parallel circuit 702 includes an inductor L2 and a capacitor C2 coupled in parallel with the inductor L2. The parallel circuit 702 may be tuned to a frequency associated with the pulsed voltage waveform generated by the pulsed voltage source 170 (FIG. 1A) so as to attenuate the pulsed voltage waveform. In this manner, the parallel circuit 702 provides additional filtering of the pulsed voltage waveform so as to prevent the pulsed voltage waveform from coupling into the radio frequency bias source 168 and potentially damaging the radio frequency bias source 168.

FIG. 7C illustrates a third embodiment of the pulsed voltage filter circuit 212 in which the pulsed voltage filter circuit 212 includes a blocking capacitor C1 and a parallel circuit 704. The blocking capacitor C1 may passes the radio frequency waveform and filters (e.g., blocks) the pulsed voltage waveform. The parallel circuit 704 includes an inductor L1 and a capacitor C2. The parallel circuit 704 may function the same manner as the parallel circuit 702 discussed above with reference to the pulsed voltage filter circuit 212 of FIG. 7B. For instance, the parallel circuit 704 may provide additional filtering of the pulsed voltage waveform so as to prevent the pulsed voltage waveform from coupling into the radio frequency bias source 168 and potentially damaging the radio frequency bias source 168.

Additional Configurations for a Radio Frequency Filter Circuit

Figure 8A:
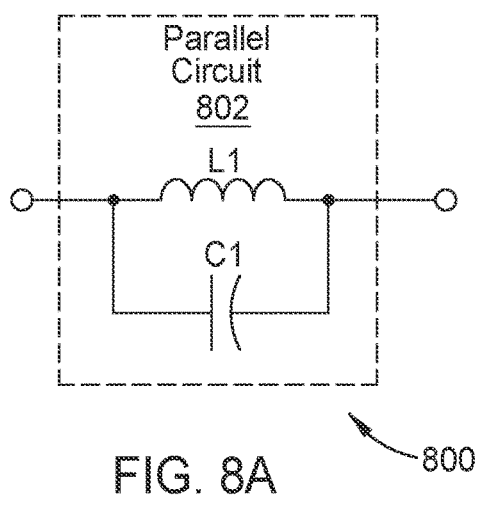
FIGS. 8A-8F depict different radio frequency filter circuits for a junction box enclosure according to some embodiments of the present disclosure.

FIGS. 8A-8F illustrate for a radio frequency filter circuit 800 for use in the junction box enclosures discussed above with reference to FIGS. 2, 5, and 6A-6C according to some embodiments of the present disclosure. For instance, FIG. 8A illustrates an embodiment of the radio frequency filter circuit 800 in which the radio frequency filter circuit 800 is a parallel circuit 802 that includes a capacitor C1 and an inductor L1 in parallel with the capacitor C1. The values of the capacitor C1 and the inductor L1 may be selected such that the parallel circuit 802 passes the pulsed voltage waveform generated by the pulsed voltage source 170 (FIG. 1A) and filters (e.g., blocks) the radio frequency waveform generated by the radio frequency bias source 168 (FIG. 1A). In this manner, the parallel circuit 802 prevents the radio frequency waveform from coupling with the pulsed voltage source 170.

Figure 8B:
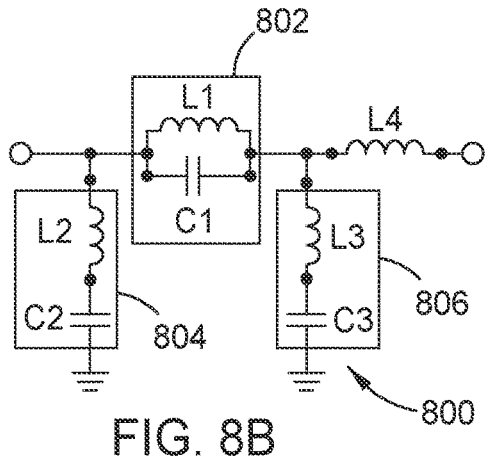

FIG. 8B illustrates a second embodiment of the radio frequency filter circuit 800. As shown, the radio frequency filter circuit 800 includes the parallel circuit 802 described above with reference to FIG. 8A. The radio frequency filter circuit 800 also includes a first series circuit 804 that include a capacitor C2 and an inductor L2. The first series circuit may be configured to filter (e.g., block) certain harmonics of a main frequency (e.g., a frequency of the pulsed voltage waveform).

The radio frequency filter circuit 800 of FIG. 8B also includes a second series circuit 806 and an inductor L4. The inductor L4 and the second series circuit 806 may be used to tune (e.g., block) certain frequencies.

Figure 8C:
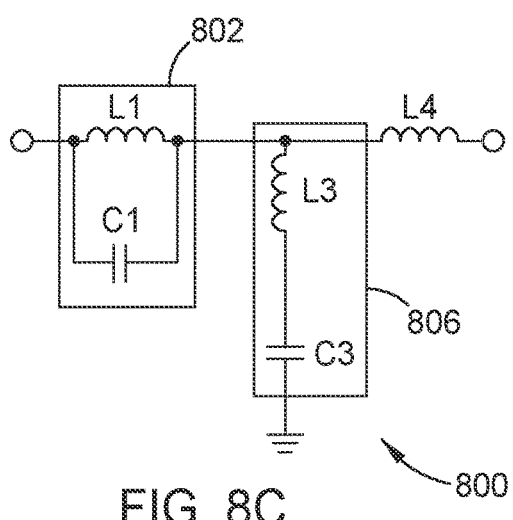

FIG. 8C illustrates a third embodiment of the radio frequency filter circuit 800. The radio frequency filter circuit 800 of FIG. 8C is similar to the radio frequency filter circuit 800 discussed above with reference to FIG. 8B. For instance, the radio frequency filter circuit 800 of FIG. 8C includes the parallel circuit 802 and the inductor L4. However, the radio frequency filter circuit 800 of FIG. 8C only includes one of the series circuits. More specifically, the radio frequency filter circuit 800 of FIG. 8C only includes the second series circuit 806. In this manner, the radio frequency filter circuit 800 of FIG. 8C illustrates that the first series circuit 804 included in the radio frequency filter circuit 800 of FIG. 8B is optional.

Figure 8D:
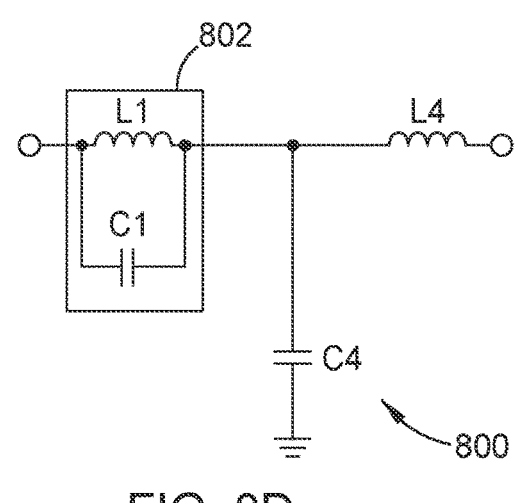

FIG. 8D illustrates a fourth embodiment of the radio frequency filter circuit 800. The radio frequency filter circuit 800 of FIG. 8D is similar to the radio frequency filter circuit 800 of FIG. 8C. For instance, the radio frequency filter circuit 800 of FIG. 8D includes the parallel circuit 802 and the inductor L4. However, the radio frequency filter circuit 800 of FIG. 8D does not include the inductor L3 that is included in the radio frequency filter circuit of FIG. 8C.

In addition, the radio frequency filter circuit 800 of FIG. 8D includes a capacitor C4 coupled in parallel with the parallel circuit 802 and the inductor L4. The capacitor C4 is added to filter out high frequency components associated with the radio frequency waveform and therefore further improve performance of the radio frequency filter circuit 800. The capacitor C4 may also affect the pulsed voltage waveform generated by the pulsed voltage source 170 (FIG. 1A).

Figure 8E:
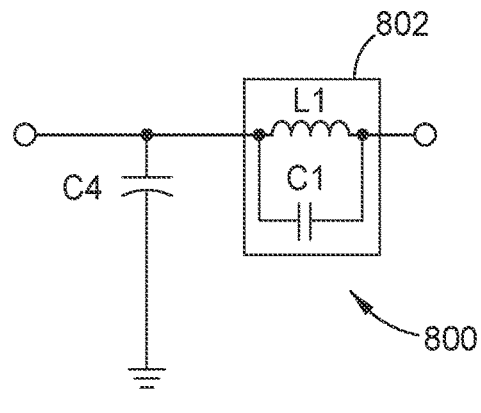
Figure 8E:

FIG. 8E illustrates a fifth embodiment of the radio frequency filter circuit 800. The radio frequency filter circuit 800 of FIG. 8E is similar to the radio frequency filter circuit 800 of FIG. 8D. For instance, the radio frequency filter circuit 800 of FIG. 8E includes the parallel circuit 802 and the capacitor C4. However, the radio frequency filter circuit 800 of FIG. 8E does not include the inductor L4.

Figure 8F:
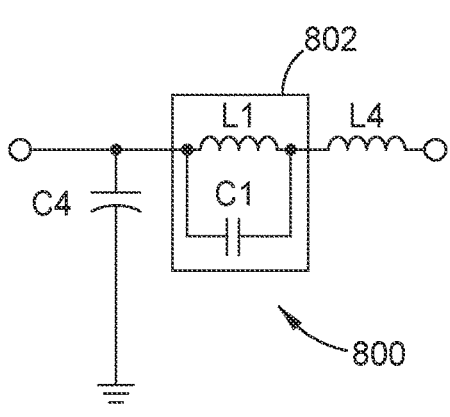

FIG. 8F illustrates a sixth embodiment of the radio frequency filter circuit 800. The radio frequency filter circuit 800 is similar to the radio frequency filter circuit 800 of FIG. 8D. For instance, the radio frequency filter circuit 800 includes the parallel circuit 802, the inductor L4, and the capacitor C4. However, the inductor L4 and capacitor C4 are arranged differently. For instance, the parallel circuit 802 is coupled between the capacitor C4 and the inductor L4.

ADDITIONAL CONSIDERATIONS

While this specification contains many specific implementation details, these should not be construed as limitations on the scope of what may be claimed, but rather as descriptions of features that may be specific to particular implementations. Certain features that are described in this specification in the context of separate implementations may also be implemented, in combination, in a single implementation. Conversely, various features that are described in the context of a single implementation may also be implemented in multiple implementations, separately, or in any suitable sub-combination. Moreover, although previously described features may be described as acting in certain combinations and even initially claimed as such, one or more features from a claimed combination may, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional) to achieve desirable results. In certain circumstances, multitasking or parallel processing (or a combination of multitasking and parallel processing) may be advantageous and performed as deemed appropriate. While the various steps in an embodiment method or process are presented and described sequentially, one of ordinary skill in the art will appreciate that some or all of the steps may be executed in different order, may be combined or omitted, and some or all of the steps may be executed in parallel. The steps may be performed actively or passively. The method or process may be repeated or expanded to support multiple components or multiple users within a field environment.

Accordingly, the scope should not be considered limited to the specific arrangement of steps shown in a flowchart or diagram.

Furthermore, any claimed implementation is considered to be applicable to at least a computer-implemented method; a non-transitory, computer-readable medium storing computer-readable instructions to perform the computer-implemented method; and a computer system including a computer memory interoperability coupled with a hardware processor configured to perform the computer-implemented method or the instructions stored on the non-transitory, computer-readable medium.

Unless defined otherwise, all technical and scientific terms used have the same meaning as commonly understood by one of ordinary skill in the art to which these systems, apparatuses, methods, processes and compositions belong.

In this disclosure, the terms "top", "bottom", "side", "above", "below", "up", "down", "upward", "downward", "horizontal", "vertical", and the like do not refer to absolute directions. Instead, these terms refer to directions relative to a nonspecific plane of reference. This non-specific plane of reference may be vertical, horizontal, or other angular orientation.

The singular forms "a," "an," and "the" include plural referents, unless the context clearly dictates otherwise. Within a claim, reference to an element in the singular is not intended to mean "one and only one" unless specifically so stated, but rather "one or more." Unless specifically stated otherwise, the term "some" refers to one or more.

Embodiments of the present disclosure may suitably "comprise", "consist" or "consist essentially of" the limiting features disclosed, and may be practiced in the absence of a limiting feature not disclosed. As used here and in the appended claims, the words "comprise," "has," and "include" and all grammatical variations thereof are each intended to have an open, non-limiting meaning that does not exclude additional elements or steps.

"Optional" and "optionally" means that the subsequently described material, event, or circumstance may or may not be present or occur. The description includes instances where the material, event, or circumstance occurs and instances where it does not occur.

As used, the term "determining" encompasses a wide variety of actions. For example, "determining" may include calculating, computing, processing, deriving, investigating, looking up, for example, looking up in a table, a database or another data structure, and ascertaining. Also, "determining" may include receiving, for example, receiving information, and accessing, for example, accessing data in a memory. Also, "determining" may include resolving, selecting, choosing, and establishing.

When the word "approximately" or "about" are used, this term may mean that there may be a variance in value of up to ±10%, of up to 5%, of up to 2%, of up to 1%, of up to 0.5%, of up to 0.1%, or up to 0.01%.

Ranges may be expressed as from about one particular value to about another particular value, inclusive. When such a range is expressed, it is to be understood that another embodiment is from the one particular value to the other particular value, along with all particular values and combinations thereof within the range.

As used, terms such as "first" and "second" are arbitrarily assigned and are merely intended to differentiate between two or more components of a system, an apparatus, or a composition. It is to be understood that the words "first" and "second" serve no other purpose and are not part of the name or description of the component, nor do they necessarily define a relative location or position of the component. Furthermore, it is to be understood that that the mere use of the term "first" and "second" does not require that there be any "third" component, although that possibility is envisioned under the scope of the various embodiments described.

Although only a few example embodiments have been described in detail, those skilled in the art will readily appreciate that many modifications are possible in the example embodiments without materially departing from the disclosed scope as described. Accordingly, all such modifications are intended to be included within the scope of this disclosure as defined in the following claims. In the claims, means-plus-function clauses are intended to cover the structures described as performing the recited function and not only structural equivalents, but also equivalent structures. It is the express intention of the applicant not to invoke 35 U.S.C. § 112(f), for any limitations of any of the claims, except for those in which the claim expressly uses the words 'means for' together with an associated function.

The following claims are not intended to be limited to the embodiments provided but rather are to be accorded the full scope consistent with the language of the claims.

What is claimed is:

1. A plasma processing system comprising:
   a processing chamber defining a processing volume;
   a substrate support assembly disposed within the processing volume, the substrate support assembly comprising a radio frequency baseplate and a substrate support positioned on the radio frequency baseplate;
   a pulsed voltage source configured to generate a pulsed voltage waveform having a first frequency;
   a radio frequency source configured to generate a radio frequency waveform having a second frequency that is higher than the first frequency; and
   a junction box enclosure electrically coupling the pulsed voltage source to a direct current conductor coupled to the substrate support, the junction box enclosure further electrically coupling the pulsed voltage source to a radio frequency conductor coupled to the radio frequency baseplate, the junction box enclosure comprising:
      a pulsed voltage filter circuit coupled between the radio frequency source and the radio frequency conductor, the pulsed voltage filter circuit operable to filter the pulsed voltage waveform; and
      a radio frequency filter circuit coupled between the pulsed voltage source and the direct current conductor, the radio frequency filter circuit operable to filter the radio frequency waveform.

2. The plasma processing system of claim 1, wherein:
   the substrate support comprises a bias electrode and an edge electrode; and
   the direct current conductor is coupled to the bias electrode.

3. The plasma processing system of claim 2, further comprising:
   a conductor coupling the radio frequency baseplate to the edge electrode.

4. The plasma processing system of claim 2, wherein the junction box enclosure further comprises:
   a blocking capacitor coupled between the pulsed voltage source and the radio frequency filter circuit.

5. The plasma processing system of claim 2, wherein the radio frequency filter circuit comprises a first radio frequency filter circuit, and wherein the junction box enclosure further comprises:

a second radio frequency filter circuit coupled between the pulsed voltage source and the radio frequency conductor coupled to the radio frequency baseplate, the second radio frequency filter circuit configured to filter the radio frequency waveform.

6. The plasma processing system of claim 5, wherein the junction box enclosure further comprises:
   a first blocking capacitor coupled between the pulsed voltage source and the direct current conductor; and
   a second blocking capacitor coupled between the pulsed voltage source and the radio frequency conductor.

7. The plasma processing system of claim 1, wherein the second frequency ranges from 2 megahertz to 200 megahertz.

8. The plasma processing system of claim 7, wherein the second frequency is less than 2 megahertz.

9. The plasma processing system of claim 2, wherein:
   the pulsed voltage filter circuit comprises a bandpass filter; and
   the radio frequency filter circuit comprises a bandstop filter.

10. A plasma processing system comprising:
   a processing chamber defining a processing volume;
   a substrate support assembly disposed within the processing volume, the substrate support assembly comprising a radio frequency baseplate and a substrate support positioned on the radio frequency baseplate;
   an inductively coupled plasma assembly comprising a radio frequency coil positioned outside of the processing volume, the inductively coupled plasma assembly further comprising a first radio frequency source configured to drive the radio frequency coil;
   a pulsed voltage source configured to generate a pulsed voltage waveform having a first frequency;
   a second radio frequency source configured to generate a radio frequency waveform having a second frequency that is higher than the first frequency; and
   a junction box enclosure electrically coupling the pulsed voltage source to a direct current conductor coupled to the substrate support, the junction box enclosure further electrically coupling the pulsed voltage source to a radio frequency conductor coupled to the radio frequency baseplate, the junction box enclosure comprising:
      a pulsed voltage filter circuit coupled between the second radio frequency source and the radio frequency conductor, the pulsed voltage filter circuit operable to filter the pulsed voltage waveform; and
      a radio frequency filter circuit coupled between the pulsed voltage source and the direct current conductor, the radio frequency filter circuit operable to filter the radio frequency waveform.

11. The plasma processing system of claim 10, wherein:
   the substrate support comprises a bias electrode and an edge electrode; and
   the direct current conductor is coupled to the bias electrode.

12. The plasma processing system of claim 11, further comprising:
   a conductor coupling the radio frequency baseplate to the edge electrode.

13. The plasma processing system of claim 11, wherein the junction box enclosure further comprises:
   a blocking capacitor coupled between the pulsed voltage source and the radio frequency filter circuit.

14. The plasma processing system of claim 11, wherein the radio frequency filter circuit comprises a first radio frequency filter circuit, and wherein the junction box enclosure further comprises:
   a second radio frequency filter circuit coupled between the pulsed voltage source and the radio frequency conductor coupled to the radio frequency baseplate, the second radio frequency filter circuit configured to filter the radio frequency waveform.

15. The plasma processing system of claim 14, wherein the junction box enclosure further comprises:
   a first blocking capacitor coupled between the pulsed voltage source and the direct current conductor; and
   a second blocking capacitor coupled between the pulsed voltage source and the radio frequency conductor.

16. The plasma processing system of claim 10, wherein the pulsed voltage filter circuit comprises a blocking capacitor.

17. The plasma processing system of claim 10, wherein the first radio frequency source is configure to generate the radio frequency waveform having the second frequency.

18. The plasma processing system of claim 10, wherein the pulsed voltage waveform comprises a series of harmonics including a fundamental harmonic and one or more additional harmonics, and wherein the first frequency corresponds to the fundamental harmonic.

19. The plasma processing system of claim 10, further comprising:
   a direct current power source operable to generate a high voltage direct current voltage waveform; and
   wherein the junction box enclosure electrically couples the direct current power source to the radio frequency filter circuit.

20. The plasma processing system of claim 19, wherein the junction box enclosure further comprises:
   a bias compensation module coupled between the direct current power source and the radio frequency filter circuit.

* * * * *